(12) United States Patent
Han

(10) Patent No.: US 6,320,806 B1
(45) Date of Patent: Nov. 20, 2001

(54) INPUT/OUTPUT LINE PRECHARGE CIRCUIT AND SEMICONDUCTOR MEMORY DEVICE ADOPTING THE SAME

(75) Inventor: Jae-cheol Han, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/399,934

(22) Filed: Sep. 21, 1999

(30) Foreign Application Priority Data

Sep. 22, 1998 (KR) ................................. 98-39224

(51) Int. Cl.⁷ ........................................ G11C 7/00
(52) U.S. Cl. .................. 365/203; 365/190; 365/189.05; 365/189.11
(58) Field of Search .................. 365/203, 190, 365/189.01, 189.11, 189.05, 207

(56) References Cited

U.S. PATENT DOCUMENTS 5,862,090 * 1/1999 Numata et al. ............... 365/203
5,973,972 * 10/1999 Kwon et al. ................. 365/203

FOREIGN PATENT DOCUMENTS 7-037387  2/1995  (JP) .

* cited by examiner

Primary Examiner—David Nelms
Assistant Examiner—David Lam
(74) Attorney, Agent, or Firm—Skjerven Morrill MacPherson LLP; David W. Heid

(57) ABSTRACT

A precharge circuit for a memory device includes a first precharge sub-circuit that precharges data input/output lines to a first level for a write operation, and a second precharge sub-circuit that precharges the data input/output lines to a second level higher than the first level for a read operation. Therefore, even when a power supply voltage of the semiconductor memory is low, the input/output lines are precharged to a sufficiently high voltage and an input/output sense amplifier can operate normally, thereby outputting correct data.

14 Claims, 7 Drawing Sheets

INPUT/OUTPUT LINE PRECHARGE CIRCUIT AND SEMICONDUCTOR MEMORY DEVICE ADOPTING THE SAME

BACKGROUND OF THE INVENTION

1. Field of the Invention

The present invention relates to a semiconductor memory device, and more particularly, to an input/output sense amplifier of a semiconductor memory device.

2. Description of the Related Art

In general, a dynamic random access memory (DRAM) includes a plurality of memory cell arrays, each divided into a plurality of sub-arrays. Each memory cell included in a memory cell sub-array is randomly accessed to store data therein and to output the data stored therein.

FIG. 1 shows a conventional semiconductor memory device. When writing data to a memory, data DI is inputted to an input buffer 18 and latched by an input latch 20. After global input/output lines GIO and /GIO are precharged by a precharge circuit 24, the latched data is applied to the global input/output lines GIO and /GIO via an input driver 22. Here, one memory cell within a memory cell array 10 is selected by a word line WL activated by a row decoder 14 and a column selection line CSL activated by a column decoder 16, and the data on the global input/output lines GIO and /GIO are written to the selected memory cell via a local input/output line LIO.

Also, when reading data written to the memory device, a specific word line WL is activated by row decoder 14. Then, the cells connected to word line WL transfer data to corresponding bit lines and bit line sense amplifiers (not shown) sense the signals on the bit lines. Data from a bit line among the plurality of bit lines is selected by column selection line CSL activated by column decoder 16, and transferred via local input/output line LIO to global input/output lines GIO and /GIO that were precharged by precharge circuit 24. The data on global input/output lines GIO and /GIO are amplified by an input/output (I/O) sense amplifier 26, and then outputted via an output buffer 28.

As described above, when writing data to the memory or reading the data from the memory device, global input/output lines GIO and /GIO are precharged. Then, data is written to or read from precharged global input/output lines GIO and /GIO. In particular, when writing data in the conventional memory device, the precharge level of global input/output lines GIO and /GIO is set to be the same as the precharge level when the data is read from the memory device.

FIG. 2 is a graph showing the change in potential over time on global input/output lines GIO and /GIO in the semiconductor memory device of FIG. 1. Writing occurs during intervals T12 and T14 and reading occurs during interval T16. Before writing or reading, global input/output lines GIO and /GIO are precharged during intervals T13 and T15. As shown in FIG. 2, the precharge levels of global input/output lines GIO and /GIO are equal to 1.45V in intervals T14 and T16.

Also, in order to reduce power consumption in memory devices, power supply voltages for such devices have decreased. As the power supply voltages have decreased, the precharge levels of the input/output lines have correspondingly decreased. However, if the precharge level is too low, a semiconductor device cannot operate normally. Such abnormal operation is more serious when reading from the memory device than when writing to the memory device. In particular, when the precharge level is low, an input/output sense amplifier does not operate normally, making it difficult to obtain the correct data from the memory device.

SUMMARY OF THE INVENTION

To solve the above problems, embodiments of the present invention provide a precharge circuit of a semiconductor memory device which operates at a comparatively low power supply voltage and is capable of precharging input/output lines to a sufficiently high voltage during a reading operation.

In accordance with one embodiment of the invention, a semiconductor memory device includes: first and second data input/output lines; a memory cell array including a plurality of memory cells, each storing data and accessed by word lines and paired bit lines; a row decoder for receiving a row address and decoding the row address to activate one of the word lines; a column decoder for receiving a column address and decoding the column address to activate one of the column selection lines, thereby connecting a pair of bit lines to the first and second data input/output lines; an input buffer for receiving data to be written; an input driver that varies the voltages of the first and second data input/output lines according to the data to be written; an input/output line sense amplifier for sensing the voltages of the first and second data input/output lines and amplifying the voltages during a read operation; an output buffer for buffering the outputs; of the input/output line sense amplifier to output read data; and a precharge circuit for precharging the first and second data input/output lines before the writing and read operations.

BRIEF DESCRIPTION OF THE DRAWINGS

The features and advantages of the present invention will become more apparent by describing embodiments thereof with reference to the attached drawings in which.

Use of the same reference numerals in different drawings represents the same or similar elements.

DESCRIPTION OF THE PREFERRED EMBODIMENTS

The present invention will now be described more fully with reference to the accompanying drawings, in which embodiments of the invention are shown. This invention may, however, be embodied in many different forms, and should not be construed as being limited to the embodiments set forth herein; rather, these embodiments are provided so that this disclosure will be thorough and complete, and will convey the concepts of the invention to those skilled in the art.

Figure 1:
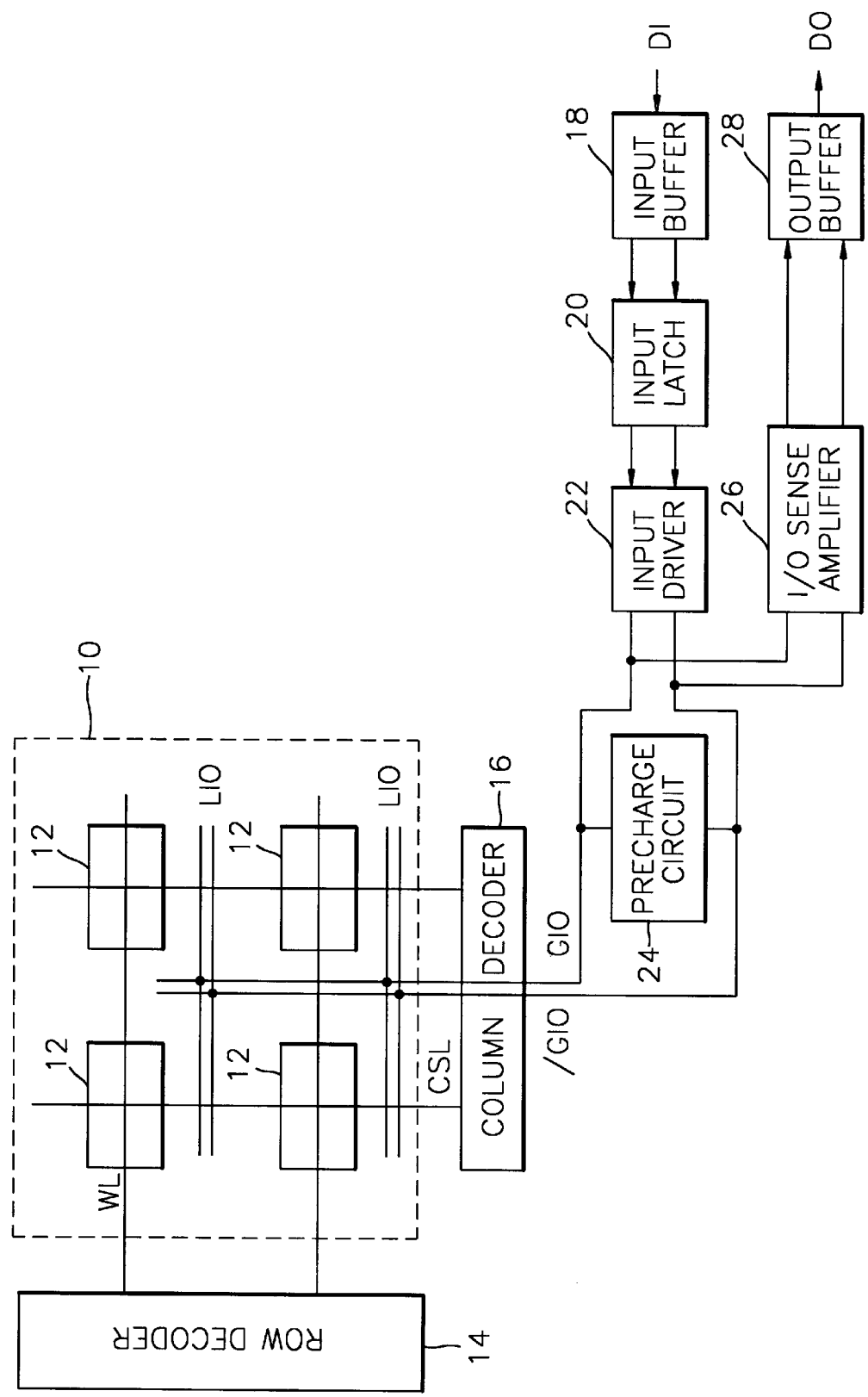
FIG. 1 is a block diagram showing a conventional semiconductor memory device.
Figure 2:
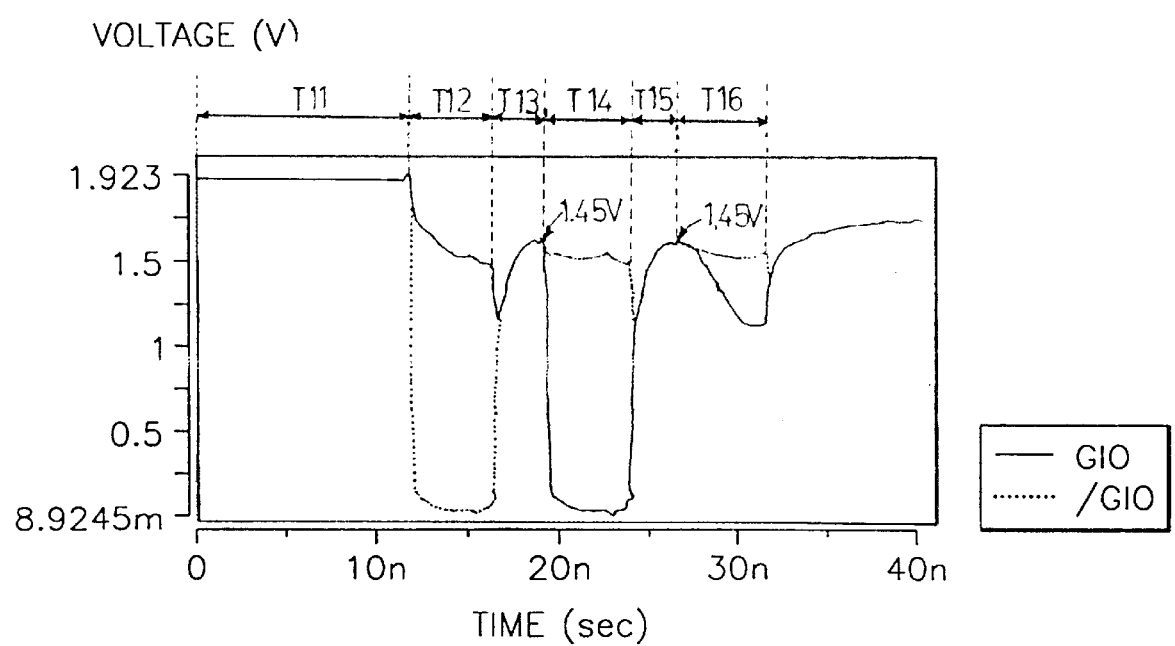
FIG. 2 is a graph showing the change in potential of input/output lines with time in the semiconductor memory device shown in FIG. 1.
Figure 3:
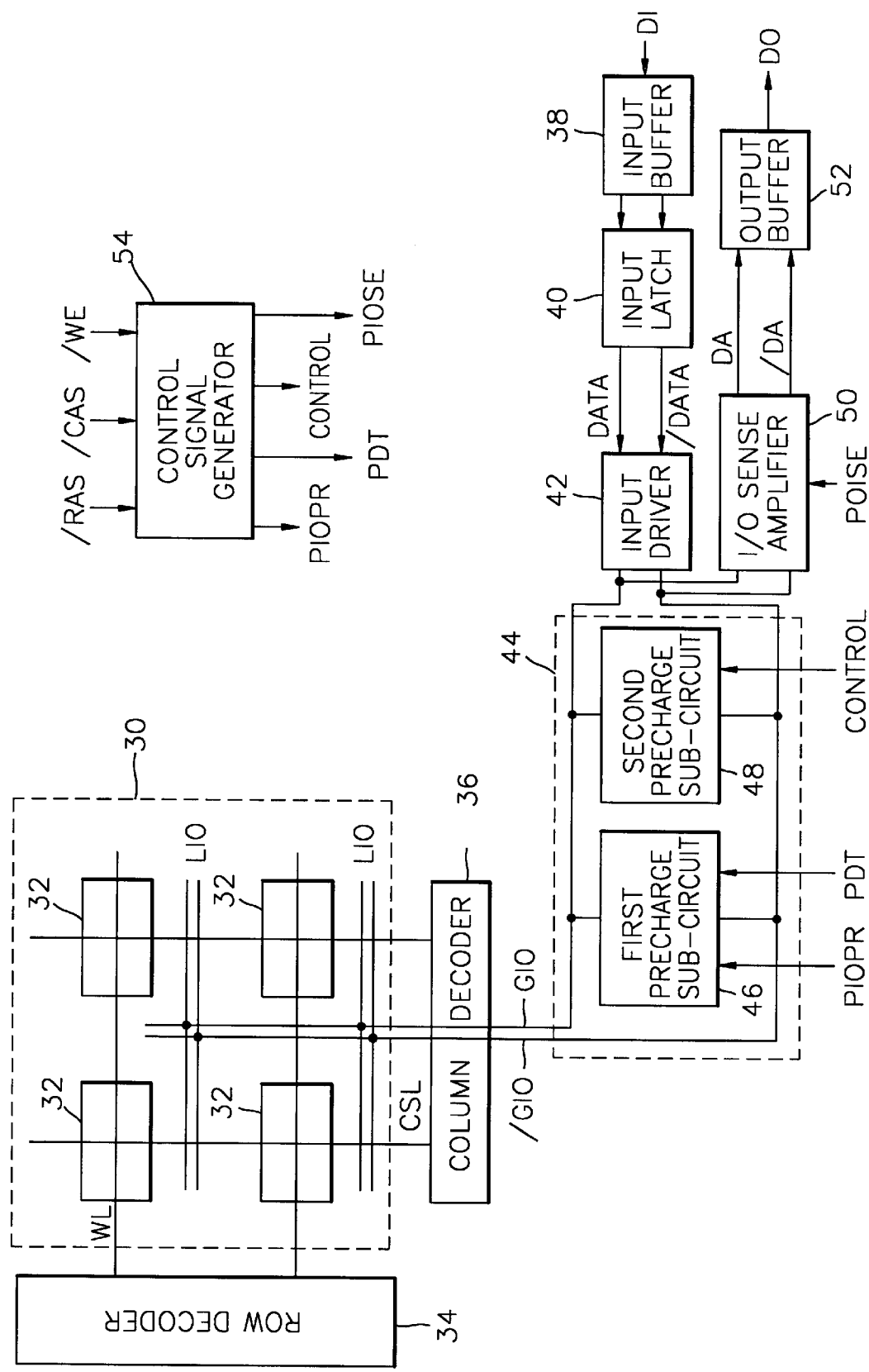
FIG. 3 is a block diagram showing a semiconductor memory device according to an embodiment of the present invention.

FIG. 3 shows a semiconductor memory device such as a DRAM according to an embodiment of the present invention. The memory includes a memory cell array 30, a row decoder 34, a column decoder 36, an input buffer 38, an input latch 40, an input driver 42, a precharge circuit 44, an input/output (I/O) sense amplifier 50, an output buffer 52, and a control signal generator 54.

Memory cell array 30 is divided into a plurality of memory cell sub-arrays 32, and each memory cell sub-array 32 includes a plurality of memory cells.

Row decoder 34 receives a row address input via an address bus (not shown) and decodes the input row address to activate one of a plurality of word lines WL. Column decoder 34 receives a column address input via the address bus and decodes the input column address to activate one of a plurality of column selection lines CSL, such that each corresponding bit line (not shown) is connected to a local input/output line LIO.

Input buffer 38 receives data DI to be written and generates paired data signals which have complementary logic levels. Input latch 40 receives the paired data signals from input buffer 38 and drives global input/output lines GIO and /GIO according to the paired data signals.

Precharge circuit 44 includes a first precharge sub-circuit 46 and a second precharge sub-circuit 48. During write operations first precharge sub-circuit 46 precharges the global input/output lines GIO and /GIO in response to a precharge control signal PIOPR and a data transfer control signal PDT. Second precharge sub-circuit 48, which does not operate during the write operation, precharges global input/output lines GIO and /GIO in response to a control signal CONTROL during a read operation.

I/O line sense amplifier 50 senses the data signals on global input/output lines GIO and /GIO and amplifies the data signals during read operations. Also, output buffer 52 buffers the data amplified by I/O line sense amplifier 50 to increase current driving capability, and outputs a buffered data signal DO.

Control signal generator 54 receives input signals such as a row address strobe signal /RAS, a column address strobe signal /CAS, and a write enable signal NVE and generates precharge control signal PIOPR and a plurality of other control signals such as data transfer control signal PDT and control signal CONTROL.

Figure 4:
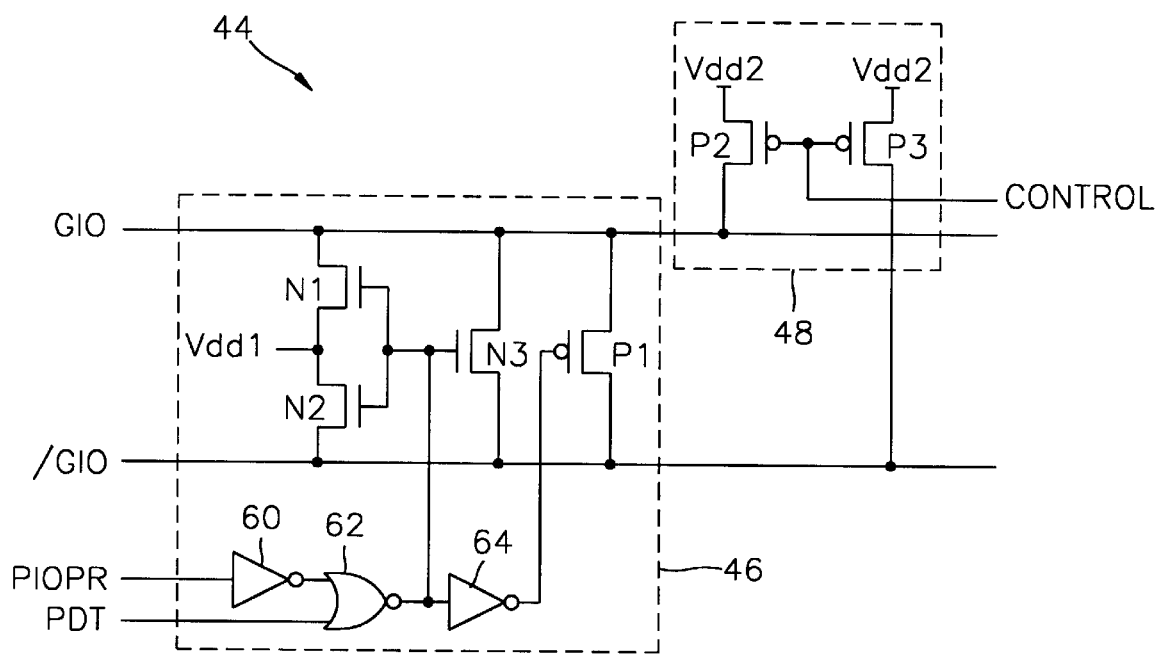
FIG. 4 is a circuit diagram of a precharge circuit of FIG. 3 according to an embodiment of the present invention.

FIG. 4 is a detailed circuit diagram of an embodiment of precharge circuit 44 of FIG. 3. In the embodiment of FIG. 4, first precharge sub-circuit 46 includes NMOS transistors N1, N2, and N3, a PMOS transistor P1, an inverter 60, a NOR gate 62, and an inverter 64. Inverter 60 receives precharge control signal PIOPR and inverts the received signal to output an inverted precharge control signal. NOR gate 62 performs a NOR operation on data transfer control signal PDT and the inverted precharge control signal from inverter 60. Inverter 64 inverts the output signal of NOR gate 62.

Transistors N1 and N2 have sources connected to global input/output lines GIO and /GIO, respectively, drains connected to a first power supply voltage Vdd1, and gates connected to an output of NOR gate 62. Transistor N3 is between input/output line GIO and complementary input/output line /GIO, and the gate of transistor N3 connects to an output of NOR gate 62. Similarly, transistor P1 is between input/output lines GIO and /GIO, and the gate of transistor P1 connects to an output terminal of inverter 64. In this embodiment, first power supply voltage Vdd1 is about 2.15 V.

Second precharge sub-circuit 48 includes two PMOS transistors P2 and P3. A second power supply voltage Vdd2 is applied to the sources of transistors P2 and P3. Control signal CONTROL is applied to the gates of transistors P2 and P3, and the drains of transistors P2 and P3, respectively, connect to input/output lines GIO and /GIO. In this embodiment, second power supply voltage Vdd2 is about 2.2V.

Figure 5:
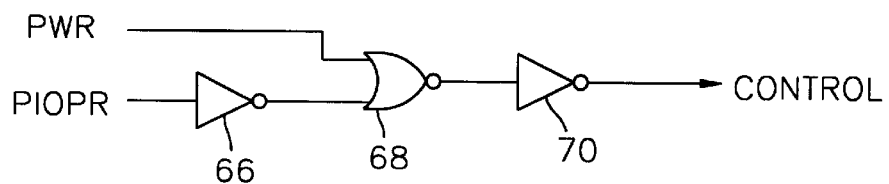
FIG. 5 is circuit diagram of a control signal generating unit for generating a control signal shown in FIG. 4.

FIG. 5 is a circuit diagram of a control signal generating unit of control signal generator 54 of FIG. 3. The control signal generating unit of FIG. 5 generates control signal CONTROL and includes two inverters 66 and 70 and a NOR gate 68. Inverter 66 receives precharge control signal PIOPR and inverts the received signal. NOR gate 68 performs a NOR operation on inverted precharge control signal /PIOPR and a write control signal PWR. Inverter 70 receives the output signal of NOR gate 68 and inverts the received signal to output control signal CONTROL.

Figure 6:
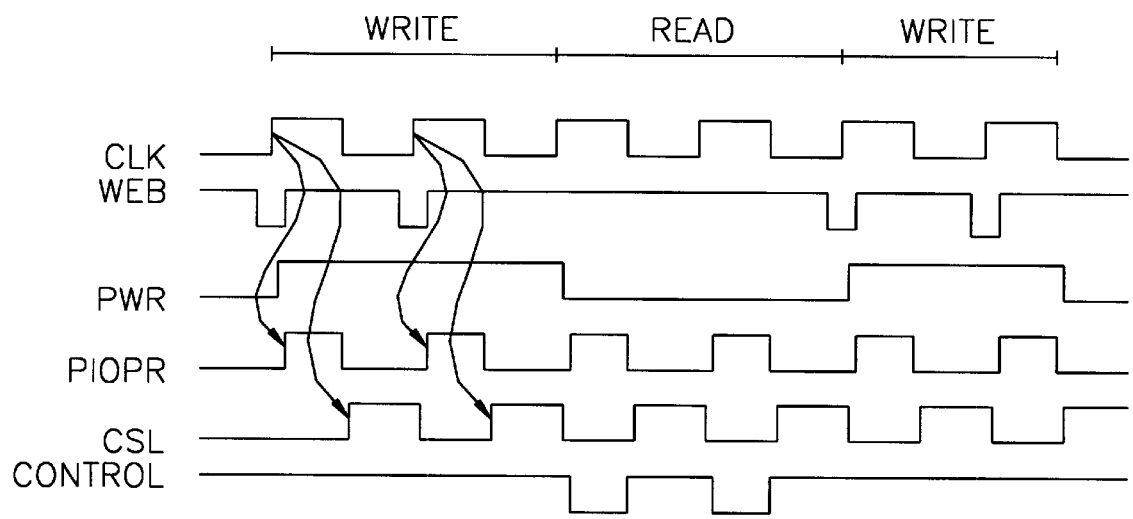
FIG. 6 is a timing diagram of signals shown in FIG. 5, for illustrating operation of the control signal generator of FIG. 5.

FIG. 6 is a timing diagram of the signals shown in FIG. 5. During a write or read operation precharge control signal PIOPR is activated to a high level for a predetermined period of time before column selection line CSL is activated to a high level. Write control signal PWR is activated to a high level only during the write operation and not activated (e.g., at a low level) during read operations. Control signal CONTROL is a signal activated at a low level, i.e., an active-low signal, which is activated only when precharge control signal PIOPR is high and write control signal PWR is low. That is, control signal CONTROL is activated to a low level only during precharging for a read operation.

Precharge circuit 44 of FIG. 4 operates as follows.

In first precharge sub-circuit 46, the output signal from NOR gate 62 is high only when precharge control signal PIOPR is high and data transfer control signal PDT is low. When the output signal from NOR gate 62 is high, transistors N1 and N2 turn on to global input/output lines GIO and /GIO to the first power supply voltage Vdd1. Transistors N3 and P1 also turn on so that the potentials of global input/output lines GIO and /GIO rapidly equalize. When precharge control signal PIOPR is not activated (at a high level) or data transfer control signal PDT is activated (at a high level), transistors N1, N2, N3 and P1 turn off, thereby ending the precharge operation. As above, first precharge sub-circuit 46 is enabled for charging global input/output lines GIO and /GIO only before the data is transferred for a write or read operation.

In second precharge sub-circuit 46, transistors P2 and P3 turn on when control signal CONTROL is activated, i.e., when the memory device is precharged during a read operation. Accordingly, transistors P2 and P3 charge the global input/output lines GIO and /GIO to second power supply voltage Vdd2 for a read.

As above, during a precharge interval for write operation, only first precharge sub-circuit 46 charges the global input/output lines GIO and /GIO. However, during the precharge interval for a read operation, second precharge sub-circuit 48 and first precharge sub-circuit 46 precharge global input/output lines GIO and /GIO. In particular, during the precharge interval for the read operation, the voltage difference (Vdd1-VT) between first power supply voltage Vdd1 and a threshold voltage VT of transistor N1 is transferred to global input/output line GIO in the first precharge sub-circuit 46 while second precharge sub-circuit 48 transfers second power supply voltage Vdd2 to global input/output line GIO. Thus, second precharge sub-circuit 48 predominantly controls the precharging operation for a read.

Figure 7:
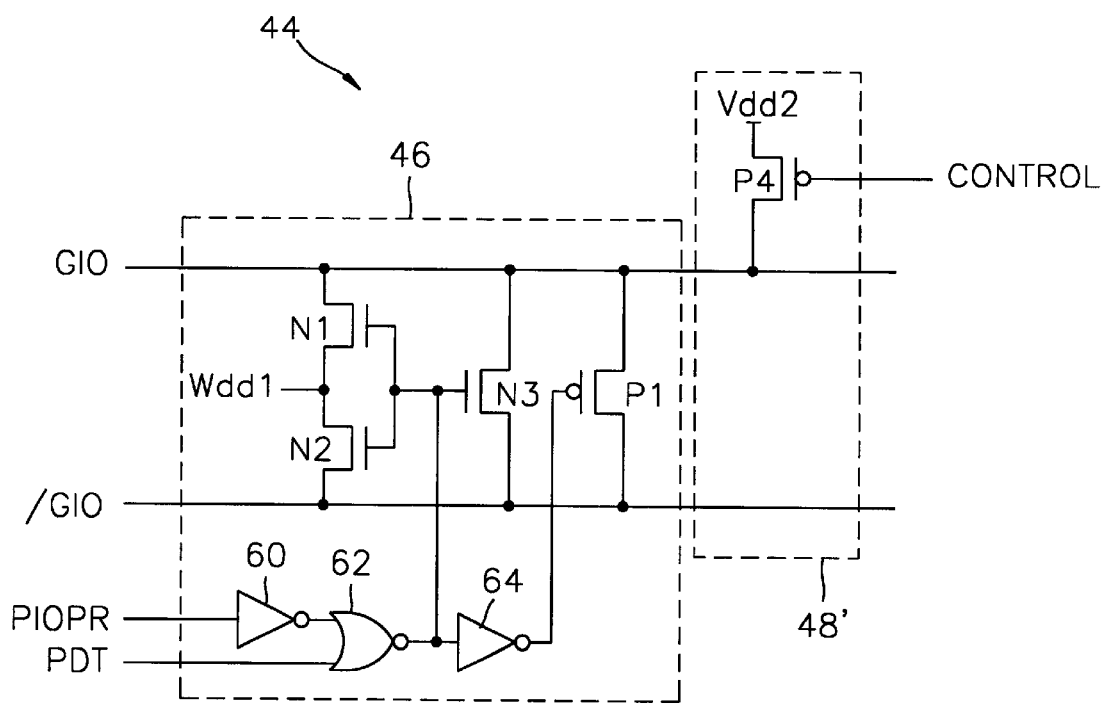
FIG. 7 is a circuit diagram of a precharge circuit of FIG. 3 according to another embodiment of the present invention.

FIG. 7 is a circuit diagram of precharge circuit 44 of FIG. 3 according to another embodiment of the present invention. Precharge circuit of FIG. 7 has the same structure as the precharge circuit of FIG. 4, except that second precharge sub-circuit 48' of FIG. 7 includes only one PMOS transistor P4. Thus, explanation of the same elements as those of FIG. 4, indicated by the same reference numerals as in FIG. 3, is omitted. In second precharge circuit 48', second power supply voltage Vdd2 is applied to the source of transistor P4 while control signal CONTROL is applied to the gate thereof. Transistor P4 of FIG. 7 has a width/length (W/L) ratio about twice those of transistors P2 and P3 of FIG. 4, and operates in the same manner as transistors P2 and P3. Transistors N3 and P1 equalize the voltages on I/O lines GIO and /GIO during precharge for a read operation.

Figure 8:
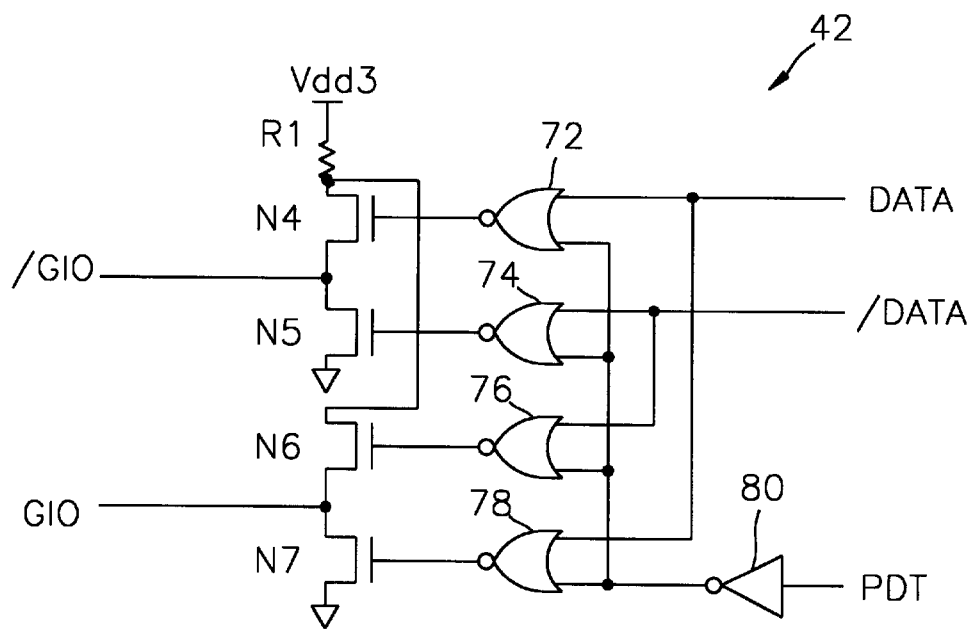
FIG. 8 is a circuit diagram of an input driver of FIG. 3.

FIG. 8 is a circuit diagram of input driver 42 of FIG. 3. Input driver 42 includes an inverter 80, NOR gates 72, 74, 76 and 78, a resistor R1 and NMOS transistors N4, N5, N6 and N7. Inverter 80 receives and inverts data transfer control signal PDT. Each of NOR gates 72 and 78 receives output signal of inverter 80 at one input and data signal DATA output from input latch 40 at the other input. Each of NOR gates 74 and 76 receives the output signal of inverter 80 at one input and inverted data signal /DATA output from input latch 40 at the other input.

The output signals of NOR gates 72, 74, 76 and 78 are applied to gates of transistors N4, N5, N6 and N7, respectively. The drain of transistor N4 connects to a third power supply voltage Vdd3 via a resistor R1, and the source of transistor N4 connects to the drain of transistor N5. The source of transistor N5 is grounded. The drain of transistor N6 connects to the drain of transistor N4 and the source of transistor N6 connects to the drain of transistor N7. The source of transistor N7 is grounded. The source of transistor N4 and the drain of transistor N7 are connected to global input/output lines /GIO and GIO, respectively.

When data transfer control signal PDT is low, the output signal from inverter 80 is high and the output signals of NOR gates 72, 74, 76 and 78 are low. As a result, all transistors N4, N5, N6 and N7 turn off to disable input driver 42.

When data transfer control signal PDT is high, the output signal from inverter 80 is low. Here, NOR gates 72, 74, 76 and 78 invert the signals input on the other inputs. For example, when data signal DATA is high and data signal /DATA is low, the output signals from NOR gates 72 and 78 are low while the output signals from NOR gates 74 and 76 are high. In this case, only transistors N5 and N6 turn on, so that transistor N6 charges I/O line GIO to a high level and transistor N5 pulls I/O line /GIO to a low level. When the data signal DATA is low and the data signal /DATA is high, only transistors N4 and N7 turn on, so that transistor N7 pulls I/O line /GIO to a low level and transistor N4 pulls I/O line /GIO up to a high level.

Figure 9:
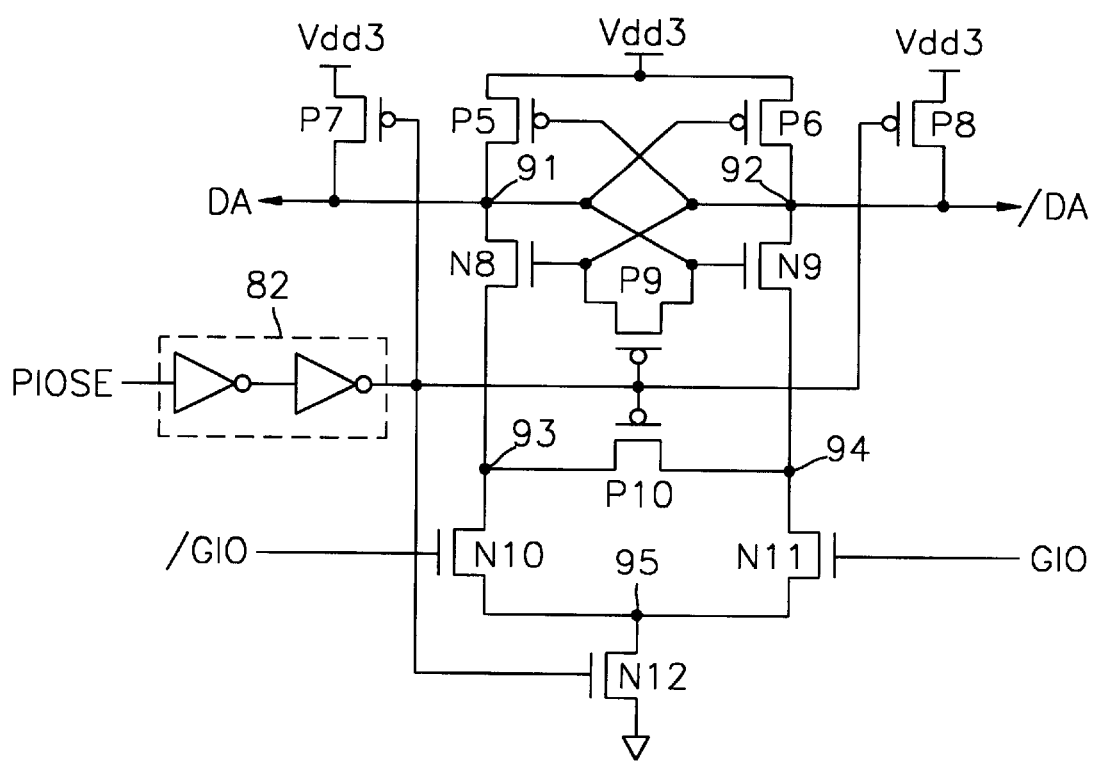
FIG. 9 is a circuit diagram of an input/output sense amplifier of FIG. 3.

FIG. 9 is a circuit diagram of the input/output sense amplifier 50 of FIG. 3. Input/output sense amplifier 50 includes transistors P5, P6, N8, and N9 forming a cross coupled differential amplifier, charging transistors P7 and P8, equalizing transistors P9 and P10, input transistors N10 and N11, a bias transistor N12 and a buffer 82.

When a read operation starts, global input/output lines GIO and /GIO are precharged to the same level, which turns on transistors N10 and N11. Sense enable signal PIOSE, which is an active-high signal applied via buffer 82, maintains a non-active low state for a predetermined period of time, turns on transistors P7 and P8, and turns off transistor N12. Accordingly, nodes 91 and 92 are both high. Also, transistors N8 and N9 are both on, so that nodes 93 and 94 are both high. In particular, the potentials of nodes 93 and 94 become equal and the gate potentials of transistors P7 and P8 become equal as well because transistors P9 and P10 are on.

A memory cell being read is connected to global input/output lines GIO and /GIO, as described above, which change the potentials on global I/O line GIO or /GIO. For example, assuming the potential of global input/output line GIO decreases slightly by charge sharing during a read and the potential of complementary global input/output line /GIO stays constant, the sense enable signal PIOSE activates to a high level when the potential difference between the global input/output lines GIO and /GIO reaches a predetermined level, and transistors P7, P8, P9 and P10 turn off. Also, transistor N12 turns on pulling node 95 to a low level.

Because transistors N10 and N11 are on, voltages on nodes 93 and 94 drop. Because the potential of global input/output line /GIO is higher than that of global input/output line GIO, transistor N10 turns on with higher potential compared to transistor N11, and the level transition of node 93 is faster than that of node 94. When a gate-source voltage of transistor N8 is higher than its threshold voltage, transistor N8 turns on, so that the potential of the node 91 decreases. Because the potential of node 91 is applied to the gate of transistor N9, transistor N9 does not turn on and the potential of node 92 is not lowered. Also, because the potential of node 91 is applied to the gate of transistor P6, transistor P6 turns on, thereby maintaining the potential of node 92 at a high level. As the potential of node 92 remains at a high level and potential of node 91 drops, transistor N9 turns off while transistor N8 turns on, thereby further lowering the potential of node 91. As a result, a read data signal DA of a low level and an inverted read data signal /DA of a high level are outputted to output buffer 52.

When writing data to a memory device, data DI is inputted to input buffer 38 and latched by input latch 40. After first precharge sub-circuit 46 precharges global input/output lines GIO and /GIO, input driver 42 applies the latched data to global input/output lines GIO and /GIO. Here, one memory cell within memory cell array 30 is selected by word line WL activated by row decoder 34 and the column selection line activated by column decoder 36. The data loaded on the global input/output lines GIO and /GIO is written to the selected memory cell via a local input/output line LIO.

When reading the data written to the memory device, a specific word line WL is activated by row decoder 34, and the data of the memory cells connected to the word line WL are transferred to the corresponding bit lines and then amplified by a bit line sense amplifier (not shown). The data of a bit line among the plurality of bit lines is selected by column selection line CSL which is activated by column decoder 36. Here, when global input/output lines GIO and /GIO are precharged by second precharge sub-circuit 48, the selected data is transferred to global input/output lines GIO and /GIO via local input/output line LIO. The data loaded on global input/output lines GIO and /GIO is amplified by input/output sense amplifier 50, and then outputted via output buffer 52.

As described above, according to the present invention, global input/output lines GIO and /GIO are charged by first precharge sub-circuit 46 when writing data to the memory device, and global input/output lines GIO and /GIO are substantially charged by second precharge sub-circuit 48 when reading the written data from the memory device.

Figure 10:
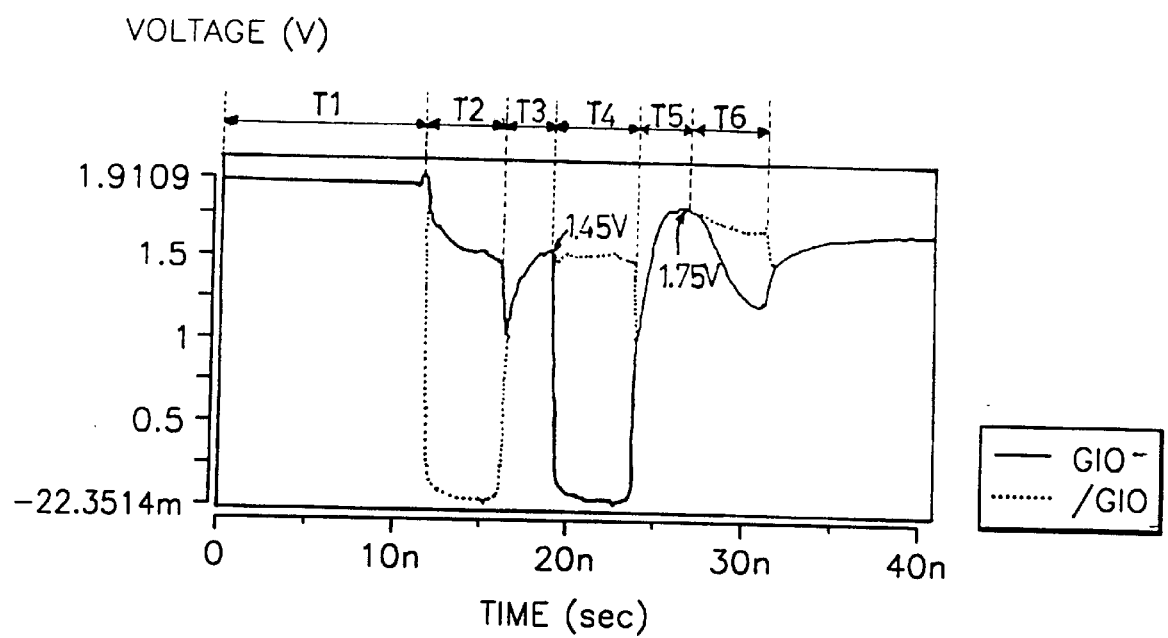
FIG. 10 is a graph showing the change in potential of input/output lines with time in the precharge circuit of the semiconductor memory device shown in FIG. 3.

FIG. 10 is a graph showing the change in potential of global input/output lines GIO and /GIO over time in the precharge circuit of semiconductor memory device shown in FIG. 3. The graph of FIG. 10 is the result simulated under the condition in which the semiconductor memory device operates in a burst mode at a frequency of 133 MHz and a temperature of 100° C. The write operation is performed during intervals T2 and T4 and the read operation is performed during interval T6. Before a write or read operation is performed, global input/output lines GIO and /GIO are precharged during intervals T3 and T5. Before the write operation in interval T4, global input/output lines GIO and /GIO are precharged to 1.45V in interval T3. However, before the reading operation in interval T6, the precharge level of the global input/output lines GIO and /GIO is 1.75V in interval T5. Thus, according to the present invention, the precharge levels of global input/output lines GIO and /GIO during the writing and reading operations are different.

As described above, according to the present invention, the global input/output lines are precharged to a higher voltage for a read operation than for a write operation. Thus, even when the power supply voltage of the semiconductor memory is low, the global input/output lines can be precharged to a sufficiently high level for a read. Accordingly, the input/output sense amplifier can operate normally, thereby providing an effect in which the memory device can output correct data.

What is claimed is:

1. An input/output line precharge circuit for a semiconductor memory device, the input/output line precharge circuit comprising:
   a first precharge sub-circuit that precharges a first input/output line and a second input/output line to a first voltage; and
   a second precharge sub-circuit that precharges at least one of the first and second input/output lines to a second voltage, the second precharge sub-circuit selectively connecting a first power supply voltage to the first input/output line in response to a first control signal.

2. The input/output line precharge circuit of claim 1, wherein the first precharge sub-circuit comprises:
   a first switch that selectively connects a second power supply voltage to the first input/output line in response to a second control signal;
   a second switch that selectively connects the second power supply voltage to the second input/output line in response to the second control signal; and
   a third switch that selectively connects the first data input/output line to the second data input/output line in response to the second control signal.

3. The input/output line precharge circuit of claim 1, wherein the second precharge sub-circuit comprises a fourth switch that selectively connects the first power supply voltage to the first input/output line in response to the first control signal.

4. The input/output line precharge circuit of claim 3, wherein the fourth switch comprises:
   a first transistor connected between the first power supply voltage and the first input/output line with a gate of the first transistor receiving the first control signal; and
   a second transistor connected between the first power supply voltage and the second input/output line with a gate of the first transistor receiving the first control signal.

5. The input/output line precharge circuit of claim 3, wherein the fourth switch comprises a first transistor connected between the first power supply voltage and the first input/output line with a gate of the first transistor receiving the first control signal.

6. The input/output line precharge circuit of claim 1, wherein the second voltage is higher than the first voltage.

7. A semiconductor memory device comprising:
   first and second data input/output lines;
   a memory cell array including a plurality of memory cells each storing data and accessed by word lines and paired bit lines;
   a row decoder that receives a row address and decodes the received row address to activate one of the word lines;
   a column decoder that receives a column address and decodes the received column address to activate one of column selection lines, thereby connecting one of the paired bit lines to the first and second data input/output lines;
   an input buffer that receives data to be written and generates paired data signals having complementary logic levels during a write operation;
   an input driver that receives the paired data signals to vary the voltages of the first and second data input/output lines according to the paired data signals;
   a sense amplifier that senses the voltages of the first and second data input/output lines and amplifies the voltages during a read operation;
   an output buffer that buffers the outputs of the sense amplifier to output read data; and
   a precharge circuit that precharges the first and second data input/output lines for the write and read operations,
   wherein the precharge circuit comprises:
      a first precharge sub-circuit that precharges the first and second data input/output lines to a first level for the write operation; and
      a second precharge sub-circuit that precharges at least one of the first and second data input/output lines to a second level for the read operation, the second precharge sub-circuit selectively connecting a first power supply voltage to the first input/output line in response to a first control signal.

8. The semiconductor memory device of claim 7, wherein the first precharge sub-circuit comprises:
   a first switch that selectively connects a second power supply voltage to the first data input/output line in response to a second control signal;
   a second switch that selectively connects the second power supply voltage to the second data input/output line in response to the second control signal; and
   a third switch that selectively connects the first data input/output line to the second data input/output line in response to the second control signal.

9. The semiconductor memory device of claim 7, wherein the second precharge sub-circuit comprises a fourth switch that selectively connects the first power supply voltage to the first input/output line in response to the first control signal.

10. The semiconductor memory device of claim 9, wherein the fourth switch comprises:
   a first transistor connected between the first power supply voltage and the first data input/output line, a gate of the first transistor receiving the first control signal; and
   a second transistor connected between the first power supply voltage and the second data input/output line, a gate of the second transistor receiving the first control signal.

11. The semiconductor memory device of claim 9, wherein the fourth switch comprises a first transistor connected between the first power supply voltage and the first data input/output lines, a gate of the fourth transistor receiving the first control signal.

12. The semiconductor memory device of claim 7, wherein the second voltage is higher than the first voltage.

13. A method for precharging input/output lines of a semiconductor memory device, the method comprising:

precharging a first and second data input/output lines to a first level before the semiconductor memory device operates in the write mode; and precharging at least one of the first and second data input/output lines to a second level before the semiconductor memory device operates in the read operation, wherein, in precharging at least one of the first and second data input/output lines to the second level, a power supply voltage is selectively connected to the first input/output line in response to a control signal.

14. The method of claim 13, wherein the semiconductor memory device includes:

a memory cell array including a plurality of memory cells each storing data and accessed by word lines and paired bit lines;

a row decoder that receives a row address and decodes the received row address to activate one of the word lines;

a column decoder that receives a column address and decodes the received column address activate one of column selection lines, thereby connecting one of the paired bit lines to the first and second data input/output lines;

an input buffer that receives data to be written to generate paired data having complementary logic levels during a write mode;

an input driver that receives the paired data to vary the voltages of the first and second data input/output lines according to the paired data;

an input/output line sense amplifier that senses the voltages of the first and second data input/output lines and amplifies the voltages during a read operation;

an output buffer that buffers the outputs of the input/output line sense amplifier to output read data; and a precharge circuit that precharges the first and second data input/output lines before the write and read operations.

* * * * *